United States Patent [19]
Alford et al.

[11] Patent Number: 5,515,004
[45] Date of Patent: May 7, 1996

[54] METHOD AND APPARATUS FOR PRECISION GAIN CONTROL FOR AMPLIFIED SIGNALS

[75] Inventors: Ronald C. Alford; Frederick L. Martin, both of Plantation, Fla.

[73] Assignee: Motorola, Inc., Schaumburg, Ill.

[21] Appl. No.: 380,868

[22] Filed: Jan. 30, 1995

[51] Int. Cl.$^6$ .................................................. H03G 3/30
[52] U.S. Cl. ...................... 330/254; 430/279; 430/280
[58] Field of Search ........................... 330/11, 129, 138, 330/254, 279, 280; 455/246.1, 247.1

[56] References Cited

U.S. PATENT DOCUMENTS

| | | | |
|---|---|---|---|
| 4,363,977 | 12/1982 | Tsuda et al. | 330/11 |
| 4,606,075 | 8/1986 | Eastmond | 455/234 |
| 4,811,423 | 3/1989 | Eastmond | 455/203 |
| 5,352,988 | 10/1994 | Park | 330/141 |

*Primary Examiner*—James B. Mullins
*Attorney, Agent, or Firm*—Andrew S. Fuller

[57] ABSTRACT

An automatic gain control circuit (100) provides precision gain control for amplified signals. An offset generator (130) generates an offset signal (132) from an output signal (108) of a variable gain amplifier, shifted according to a target signal level, and another offset signal (134) according to a base signal (106). A pulse train generator (140) compares the offset signals (108, 106) and provides a pulse train signal (142) having a particular energy content. A feedback signal (172) based on the particular energy content of the pulse train signal (142) is used to adjust the gain of the variable amplifier (110).

17 Claims, 6 Drawing Sheets

5,515,004

METHOD AND APPARATUS FOR PRECISION GAIN CONTROL FOR AMPLIFIED SIGNALS

TECHNICAL FIELD

This invention relates in general to gain control circuits, and more particularly, to precise gain control, such as for amplitude control, of amplified signals.

BACKGROUND OF THE INVENTION

An automatic gain controller is often used with amplification circuitry to control the amplitude of output signals from amplification circuitry. In radio communication circuitry, communication signals are received via a receiver, and then amplified for use in signal processing. Signals received by the receiver may be of varying signal strength. If amplified without automatic gain control (AGC), the resultant signals may have too much or too little gain, with a corresponding fluctuation of signal amplitudes. Variations in signal amplitude may cause significant problems in circuitry attempting to recover information transmitted in the received signals. Accordingly, an AGC circuit is usually employed in an effort to present a signal with relatively constant amplitude.

A typical AGC circuit detects amplitude changes in a signal to be amplified and controls the gain of the amplification stage such that if the input signal strength diminishes, the amplification gain is increased, and if the input signal strength increases, the gain of the amplification stage decreases. Thus, the automatic gain controller attempts to control the output of the amplification stage such that a signal having a relatively constant amplitude is outputted. This type of AGC is common in communication circuitry.

FIG. 1 is a block diagram 10 showing a prior art automatic gain control circuit 30 for controlling the gain of an amplifier to control the amplitude of the output signal from the amplifier. An input signal 25 is coupled to an input port 21 of a variable amplifier 20 which outputs an amplified signal 27 through an output port 22. A signal energy detector 31 is coupled to the output signal 27 to detect the information relating to the amplitude of the output signal 27. A comparator 32 takes the output of the signal energy detector 31, and compares it against some desired reference value, such as a reference voltage. Depending on the comparison results, a feedback signal generator 33 generates a feedback signal 37 which is coupled to a port 23 on the amplifier 20 to vary the gain of the amplifier 20. Such automatic gain control circuitry 30 in various forms is typical in the art.

A major problem which exists with such automatic gain control circuitry lies in the difficulty of maintaining precise control of a target amplitude level for an output signal. A significant aspect of the problem is the decision making process for determining when to make adjustments to the amplification gain. In a typical prior art automatic gain control circuitry, the signal energy detector is implemented using a rectifier and a low-pass filter which provides an average of the energy content of the signal being monitored. Generally, it is difficult to determine whether energy fluctuations detected by the low-pass filter is a result of changes in amplitude of the signal being processed, or changes in the frequency or quality of such signals. Such detail information is lost in the averaging process performed by the low-pass filter typically used. The consequence is that unnecessary adjustments may be made in the gain of the amplifier in response to changes in the signals that have nothing to do with peak amplitude or signal strength. The inability to properly and correctly characterize the peak amplitude of this signal is a problem generally encountered in prior art AGC circuits. For example, if the received signal becomes noisy, additional energy may be detected by the low-pass filter of the AGC, and an undesirable response of amplification of the noisy signal may result.

The lack of precise control offered by conventional AGC circuits is a serious deficiency in the prior art. Generally, prior art AGC circuitry responds to distortions or disruptions to the signal being processed, however caused, and may make inappropriate changes to the amplification gain of signals. In circuits requiring precise control of peak signal amplitude, such average energy AGC circuitry proves inadequate. Thus, it is desirable to have an improved apparatus and method for precisely controlling gain and/or peak amplitude of signals in an amplification circuit. dr

DETAIL DESCRIPTION OF THE PREFERRED EMBODIMENT

Figure 1:
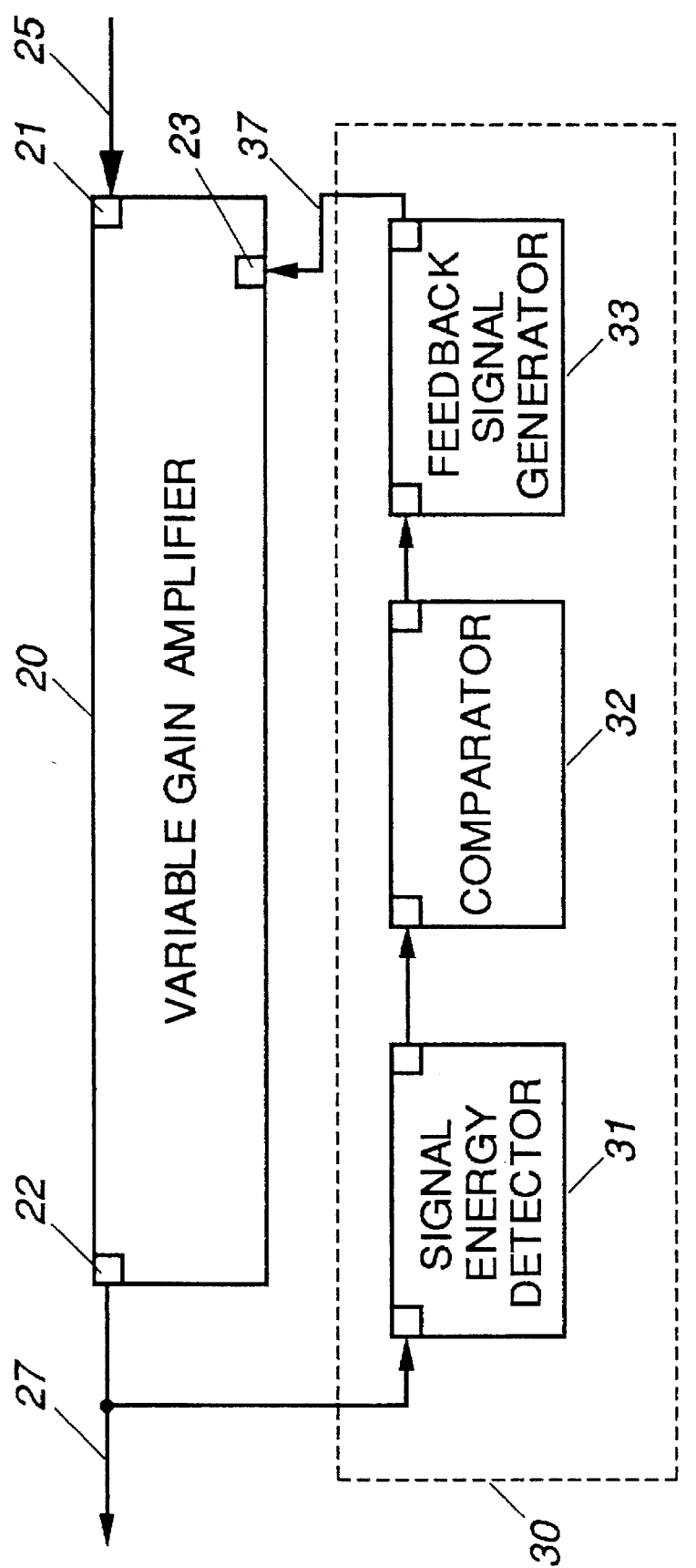
FIG. 1 is a block diagram of prior art amplification circuitry employing automatic gain control.

While the specification concludes with claims defining the features of the invention that are regarded as novel, it is believed that the invention will be better understood from a consideration of the following description in conjunction with the drawing figures, in which like reference numerals are carried forward.

Generally, the present invention provides for amplification circuitry with automatic gain control in order to provide precision control of the amplitude of the amplified signals. In one embodiment, two offset signals are generated from a differential signal corresponding to the output of an amplification stage. The first offset signal is derived from a first differential signal component that has been shifted according to a particular target level corresponding to the desired output amplitude for the differential signal. The second offset signal is derived from a second differential signal component that is not shifted according to the particular target signal level. Both offset signals are compared, or combined, to produce a pulse train having a particular energy content. A feedback signal based on the particular energy content of the pulse train is generated and used to adjust the gain of the amplification stage. Preferably, the particular energy content is compared against some reference value to determine how to adjust the feedback signal. In a second embodiment for controlling the amplitude of a single-ended signal, the first offset signal is derived from the single-ended signal, shifted according the particular signal level. The second offset signal is derived to correspond with the particular target signal level. As before, a pulse train is generated from these offset signals and then further processed to determine the feedback signal.

Figure 2:
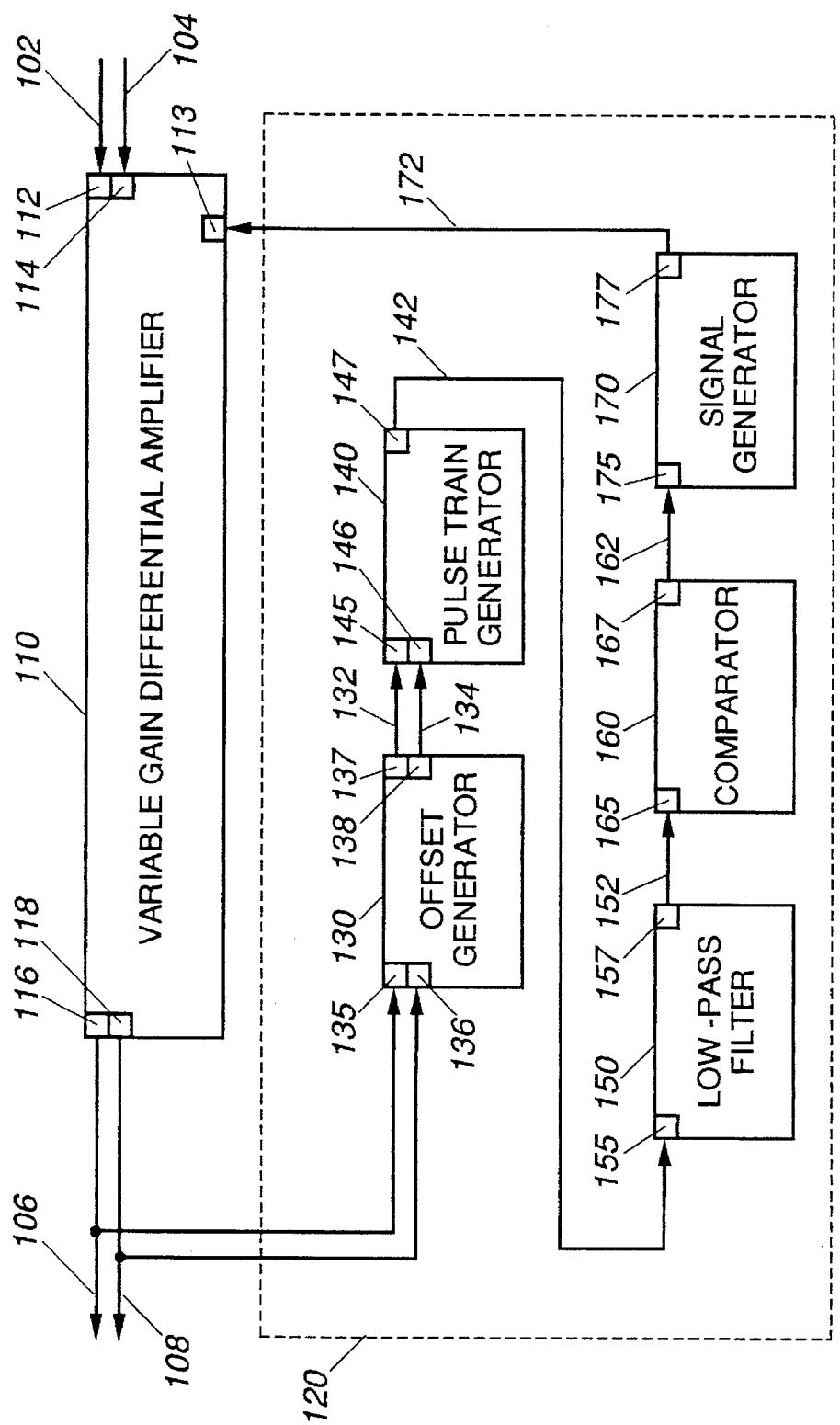
FIG. 2 is a block diagram of amplitude/gain control circuitry for controlling amplification of differential signals, in accordance with the present invention.

Referring to FIG. 2, a block diagram 100 is shown of a variable gain differential amplifier with automatic gain control circuitry, in accordance with the present invention. The variable gain differential amplifier 110 has an automatic gain control circuitry, including a feedback loop 120 coupled thereto. As a differential amplifier, the amplifier 110 has two input ports 112, 114, for receiving a differential input signal, and two output ports 116, 118, for providing an amplified differential output signal. The amplifier 110 also has a gain control port 113, such as for a feedback signal, which accepts current that can be used to vary the gain of the amplifier 110. The construction of such amplifier is well known in the art, and no further discussion of the details of construction will be provided. An input differential signal with signal components 102, 104, is coupled to the input ports 112, 114. The amplifier 110 provides a differential output signal having signal components 106, 108 via output ports 116, 118. The feedback loop 120 includes an offset generator 130, a pulse train generator 140, a low-pass filter 150, a comparator 160, and a signal generator 170.

The offset generator 130 is coupled to the output differential signal 106, 108 of the amplifier 110 through input ports 135, 136, and provides corresponding offset signals 132, 134 at its output ports 137, 138. The structure and operation of the offset generator 130 will be discussed in more detail below. The pulse train generator 140 has input ports 145, 146 connected to the output ports 137, 138 of the offset generator 130, for coupling the offset signals 132, 134 to the pulse train generator 140. The pulse train generator 140 operates to provide a pulse train signal 142 at its output port 147. The pulse train signal 142 comprises an output signal at a particular signal level that has pulses when the offset signals 132, 134 overlap. The duration of the pulses correspond to the duration of overlap for the offset signals. Preferably, the components of the pulse train generator 140 are selected to provide a fast response. More implementation details of the pulse train generator 140 are provided below.

The low-pass filter 150 has an input port 155 connected to the output port of the pulse train generator 140 for coupling pulse train signal 142 to the low-pass filter 150. The low-pass filter 150 outputs a signal 152 reflecting the average energy content of the pulse train signal 142. Preferably, the low-pass filter is formed from capacitor and a resistor coupled in a well known arrangement.

The comparator 160 has an input port 165 coupled to the output port 157 of the low-pass filter 150, so as to couple the average energy content signal 152 to the comparator 160. The comparator 160 outputs a feedback voltage 162 through output port 167. The comparator 160 functions to compare the average energy content signal 152 with a direct current reference signal (not shown) to determine the amount of feedback signal in the form of a regulated voltage output 162. The voltage level of the regulated voltage output 162 is dependent upon the amount, if any, that the average energy content of the pulse train 142 differs from the reference signal. Preferably, the comparator 160 is formed using metal oxide semiconductor (MOS) components such that it has a relatively slow response.

The signal generator 170 has an input port 175 coupled to the output port 167 of the comparator 160 to couple the regulated voltage signal 162 to the signal generator 170. The signal generator 170 generates a feedback signal 172 in the form of a feedback current based on the regulated voltage signal 162. The output port 177 of the signal generator 170 is connected to the gain control or feedback port 113 to couple the feedback signal 172 to the variable amplifier 110. In the preferred embodiment, the signal generator is a voltage-to-current converter, as well known in the art.

Figure 3:
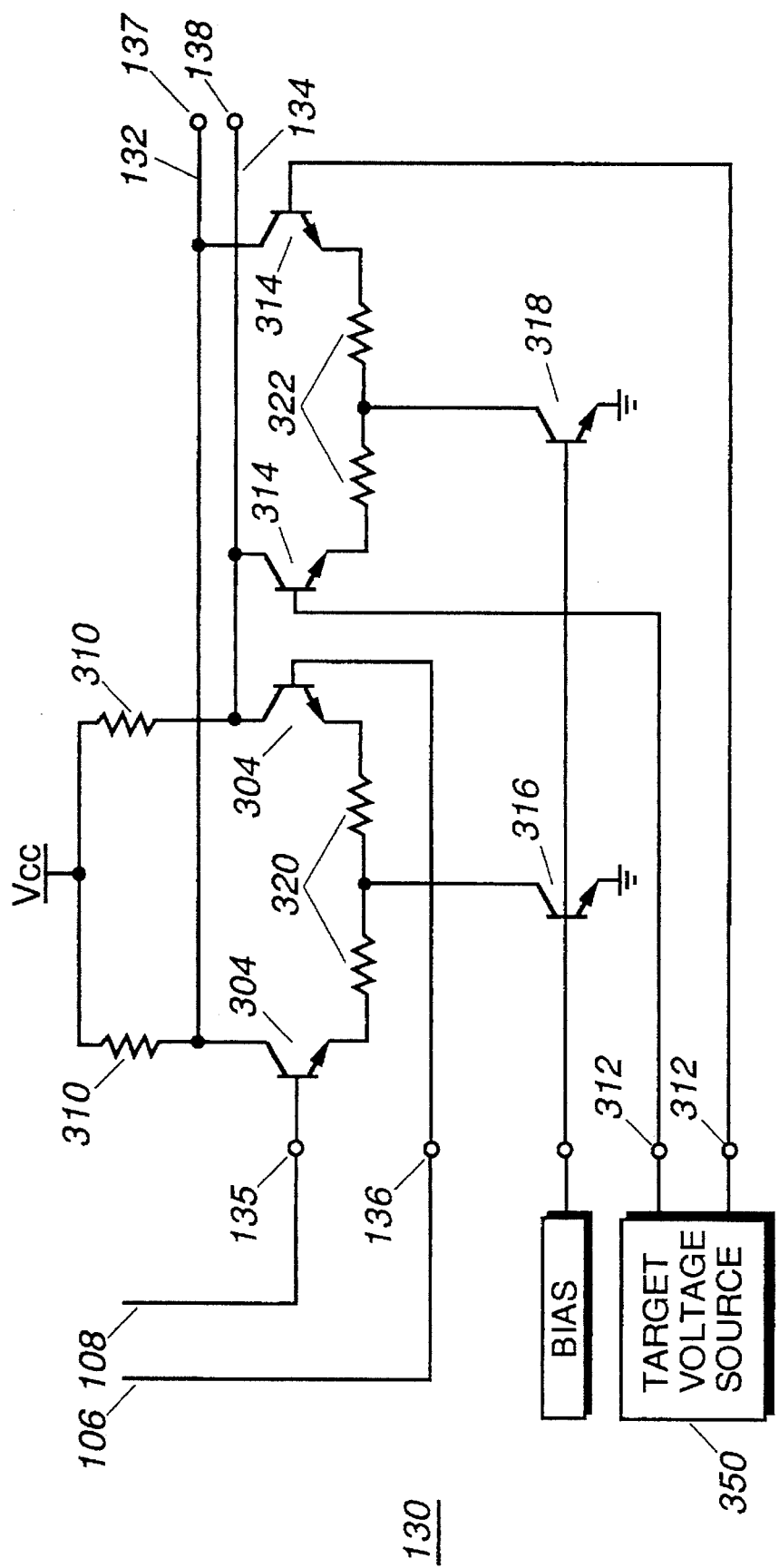
FIG. 3 is a device level schematic diagram of an offset generator, in accordance with the present invention.

As mentioned earlier, the offset generator 130 operates to shift or offset, one of the two differential signal components 106, 108, according to a target signal level, to produce first and second offset signals. Referring now to FIG. 3, a schematic of the offset generator 130 is shown, in accordance with the present invention. The offset generator 130 includes a first pair of differential transistors 304 having a corresponding pair of alternating current (AC) input terminals 135, 136 coupled thereto. A second pair of differential transistors 314 has a pair of direct current (DC) input terminals 312 coupled thereto. Both pairs of differential transistors 304, 314 share a common pair of load resistors 310. The differential signal components 106, 108 from the amplifier 110 (see FIG. 2) are coupled to the AC input terminals 135, 136 of the offset generator 130.

A DC voltage source 350 is coupled to the pair of DC input terminals 312 such that the potential across the pair of DC input terminals 312 equivalent to a particular target voltage. The target voltage corresponds to the peak signal amplitude level which is desired for the differential output signal from the variable amplifier 110. In the preferred embodiment, the target voltage is set to this desired peak signal amplitude level. A fixed bias current is provided to the pairs of differential transistors 304, 314, through bias transistors 316, 318 and input range extending resistors 320, 322, in a well known configuration. Output ports 137, 138 are coupled to the first and second pairs of differential transistors 304, 314 to present first and second offset signals 132, 134. One of the offset signals 132, 134 is derived from a differential signal component shifted by the DC target voltage. Particularly, the offset generator 130 shifts the first differential signal component 108 to derive the first offset signal 132, such as by subtracting the DC target voltage from the first differential signal component 108. The second differential signal component 106 is used as a base signal that remains unshifted to derive the second offset signal 134. The transistors 304, 314, 316, 318 and resistors 310, 320, 322 of the offset generator 130 have equal values and are closely matched by proximity in layout.

Figure 4:
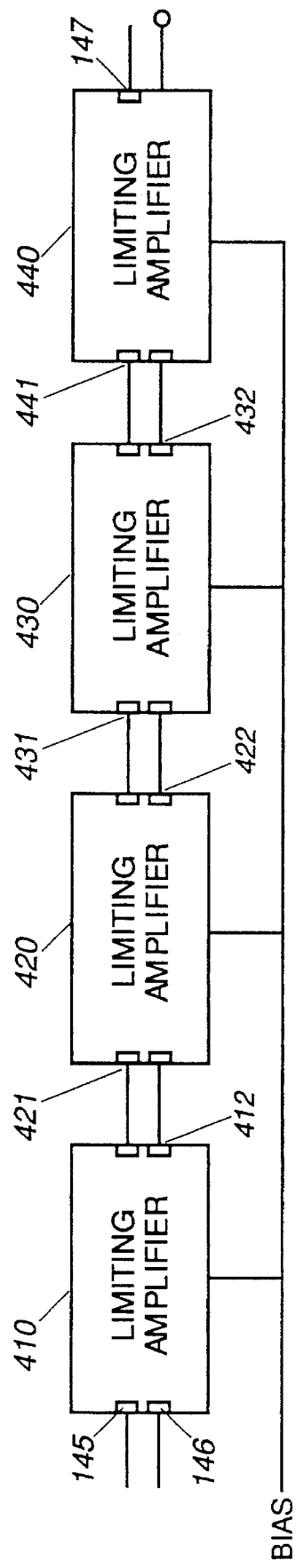
FIG. 4 is a schematic of a pulse generator implemented by serially coupled limiting amplifiers, in accordance with the present invention.

The pulse train generator 140 operates to compare, or otherwise combine, the two offset signals to produce a pulse train signal. Referring to FIG. 4, a block level diagram of the pulse train generator 140 shown, in accordance with the present invention. In the preferred embodiment, the pulse train generator 140 includes four serially coupled limiting amplifiers 410, 420, 430, 440, arranged in a fixed-bias amplifier string configuration. Each amplifier 410, 420, 430, 440, has two input ports and two output ports. The input ports 145, 146 of the first amplifier 410 forms the input ports of the pulse generator 140. The output port 147 of the fourth amplifier 440 forms the output port of the pulse generator 140. The input ports 421 of the second amplifier 420 are coupled to the output ports 412 of the first amplifier 410; the input ports 431 of the third amplifier 430 are coupled to the output port 422 of the second amplifier 420; and the input ports 441 of the fourth amplifier 440 are coupled to the output ports 432 of the third amplifier 430. Each amplifier 410, 420, 430, 440, is biased with a common bias current.

Figure 5:
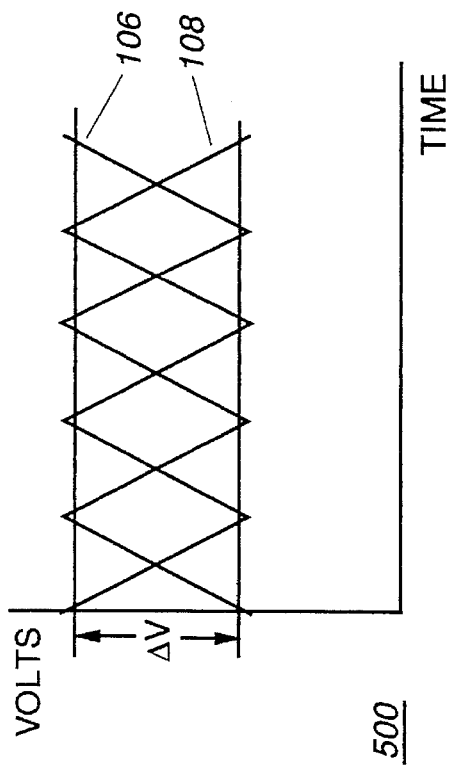
FIG. 5 is a graphical representation of differential signals outputted from an amplifier, in accordance with the present invention.
Figure 6:
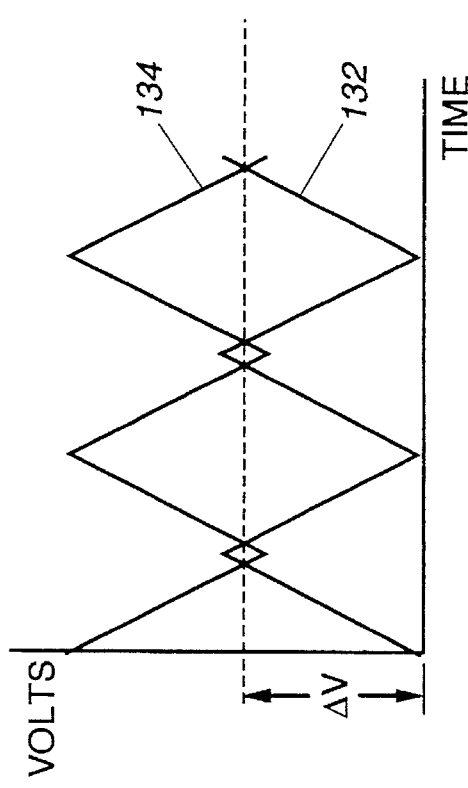
FIG. 6 is a graphical representation of the transformation of a differential output signal into offset signals by an offset generator, in accordance with the present invention.
Figure 7:
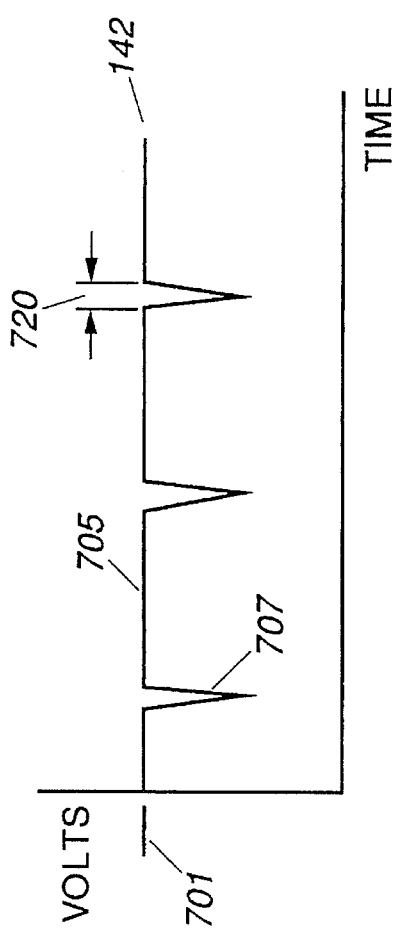
FIG. 7 is a graphical representation of the output of a pulse train generator derived from the offset signals of FIG. 6, in accordance with the present invention.

FIGS. 5, 6, and 7, show the effect on signals at various stages in the feedback loop in accordance with the present invention. Referring to FIG. 5, a graph 500 shows, by way of example, a triangle wave form representing the differential output signal from the amplifier 110, in accordance with the present invention. The differential output signal is an AC signal with first and second differential signal components 108, 106 oscillating within a specific voltage range. By way of example, the differential signal has an amplitude larger than the desired amplitude, $\Delta V$.

FIG. 6 is a graph 600 showing the output of the offset generator 130 in which the first offset signal 132 is derived from the first differential component 108 which has been shifted by the target voltage, V, and in which the second offset signal 134 is derived from the unshifted second differential signal component 106. Since the amplitude of the differential signal exceeds the target voltage as earlier stated, the first and second offset signals 132, 134 overlap in a particular region.

FIG. 7 is a graph 700 showing the output of the pulse train generator 140. Referring to FIGS. 6 and 7, the pulse train generator 140 generates a base output signal 705 at a particular signal level 701 when the first offset signal 132 is less than the second offset signal 134, and pulses the base output signal 705, i.e., produces a pulse 707, when the first offset signal 132 is greater than the second offset signal 134. The pulse 707 is generated when there is an overlap between the positive-going peak of the first offset signal 132 and the negative-going peak of the second offset signal 134. The pulse 707 exists for a duration 720, i.e., while the first offset signal is greater than the second offset signal. The output signal 705 and pulses 707 form the pulse train 142 which has an energy content that directly corresponds to the amount by which the amplitude of the differential signal 106, 108 exceeds the desired amplitude reflected by the target voltage $\Delta V$. As stated earlier, the low-pass filter 150 generates an average energy content signal reflecting this energy content, and the comparator 160 compares the energy content signal to a reference signal to determine necessary amplification gain adjustments. Particularly, the feedback signal level is increased when the average energy content signal is less than the reference signal.

Figure 8:
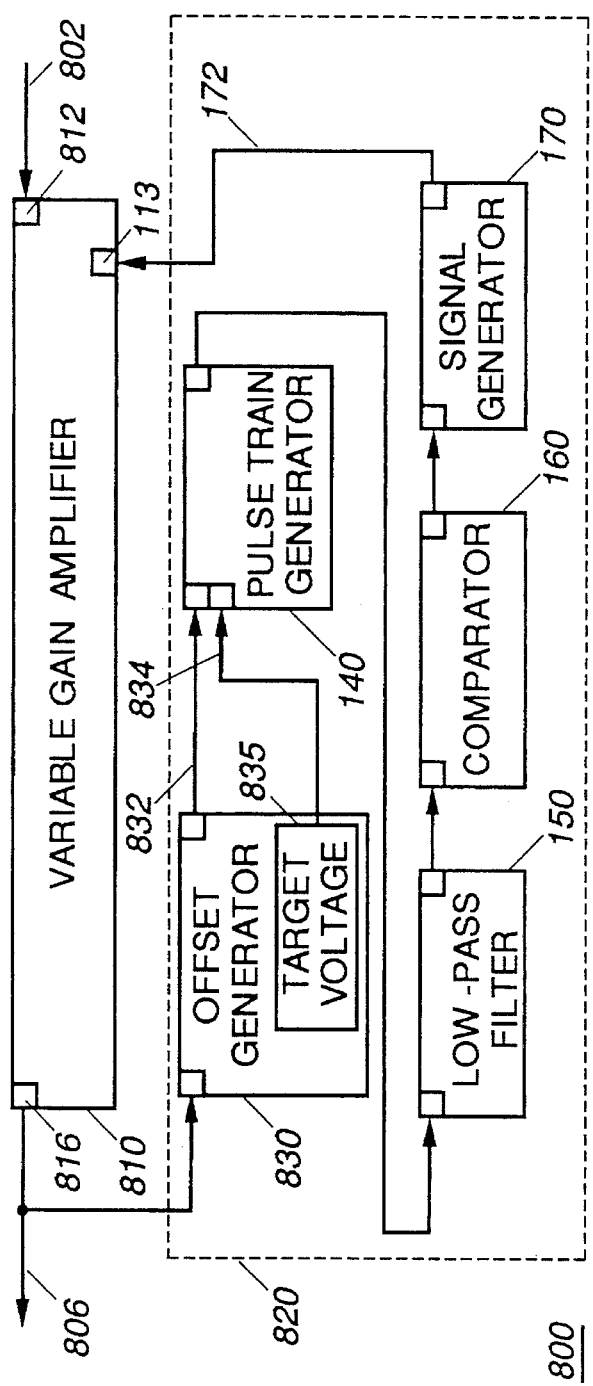
FIG. 8 is a block diagram of a second embodiment of the amplitude/gain control circuitry of FIG. 1, for controlling amplification of single-ended signals, in accordance with the present invention.

Although the previous discussion has emphasized the processing of differential signals, the concepts embodied by the present invention are applicable for maintaining precise amplitude/gain control while processing single-ended signals. FIG. 8 is a block diagram of an amplifier with automatic gain control 800, in accordance with the present invention. The amplification circuit 800 is structured to operate similar to the amplification circuit 100. Thus, like reference numerals are carried forward where structure and function correlate, and only the differences between these circuits 100, 800 are discussed. A variable gain amplifier 810 has input AC signal 802 through input port 812, and outputs an amplified AC signal 806 through output port 816. A coupled AGC circuit 820 provides precision gain control. To process the single-ended AC signal 806, an offset generator 830 operates to shift the AC signal 806 by a target voltage 835 to generate a first offset signal 832. The offset generator 830 derives a second offset signal 834 from a target voltage, or base signal, provided by a DC voltage source 835.

Figure 9:
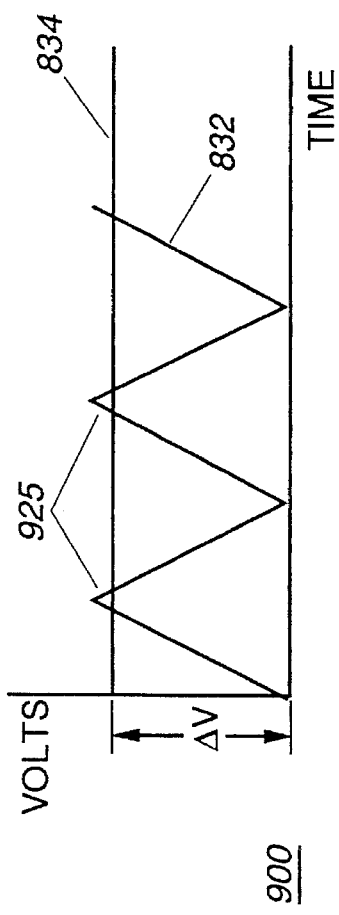
FIG. 9 is a graphical representation of the output of an offset generator for a single-ended signal, in accordance with the present invention.

FIG. 9 is a graph 900 showing the output of the offset generator 830. By way of example, it is assumed that the amplitude of the AC signal 806 has exceeded the desired target signal level. The first offset signal 832 is derived from the AC signal 806 shifted by the target voltage, V. The second offset signal 834 is derived from the DC target voltage source 835. Since the amplitude of the AC signal exceeds the target voltage as earlier stated, the peaks 925 of the first offset signal 832 overlap the second offset signal 834. The pulse train generator 140 produces pulses based on these peaks 925.

The present invention offers several advantages over the prior art. In the preferred embodiment, the AGC circuit reacts primarily to instances where the peak amplitude of the output signal exceeds a target signal level. Gain adjustments can be made rapidly when this condition occurs, to bring the signal amplitude back to within acceptable levels. Unlike prior art AGC circuits, the AGC circuit 100, 800, according to the present invention, is not as susceptible to variations in signal waveshape or quality, such as noise induced variations, or frequency fluctuations to produce erroneous gain adjustments. Further, the present invention allows AGC operation to maintain the precise peak amplitude for high frequency input signals.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of providing precision gain control for amplified signals, comprising the steps of:

generating first and second offset signals from an output signal of a variable amplifier, including the steps of:
coupling the output signal, and shifting the output signal according to a target signal level to derive the first offset signal;
coupling a base signal to derive the second offset signal;

comparing the first offset signal to the second offset signal to provide a pulse train having a particular energy content including the steps of:
generating a base output signal at a particular signal level when the first offset signal signal is than the second offset signal; and
pulsing the base output signal when the first offset signal is greater than the second offset signal; and
coupling the first and second offset signals to a plurality of serially coupled limiting amplifiers;

generating a feedback signal based on the particular energy content of the pulse train; and adjusting gain of the variable amplifier based on the feedback signal.

2. The method of claim 1, wherein the step of generating first and second offset signals, further comprises the steps of:

coupling the output signal from a first differential signal component of a differential output signal of a variable gain differential amplifier; and coupling the base signal from a second differential signal component of the differential output signal of the variable gain differential amplifier.

3. The method of claim 2, wherein the step of generating first and second offset signals, further comprises the steps:

subtracting a direct current target voltage from the first differential signal component to produce the first offset signal; and setting the second offset signal to the second differential signal component.

4. The method of claim 1, wherein the step of comparing, comprises the step of generating a pulse when the first offset signal is greater than the second offset signal.

5. The method of claim 1, wherein the step of pulsing comprises the step of pulsing the base output signal while the first offset signal is greater than the second offset signal.

6. The method of claim 1, wherein the step of generating a feedback signal, comprises the steps of:
   comparing an average energy content signal for the pulse train to a reference signal; and
   adjusting the feedback signal by an amount dependent on a difference between the average energy content signal and the reference signal.

7. The method of claim 6, wherein the step of generating a feedback signal, comprises the step of increasing feedback signal level when the average energy content signal is less than the reference signal.

8. The method of claim 1, wherein the step of generating first and second offset signals, further comprises the step of coupling a direct current target voltage source, reflecting the target signal level.

9. The method of claim 8, wherein the step of generating first and second offset signals, further comprises the step of generating the base signal from the direct current target voltage source.

10. An apparatus for providing gain control for amplifying an input signal, comprising:
    a variable gain amplifier having the input signal coupled thereto, the variable gain amplifier having an output signal;
    a feedback loop coupled to the variable gain amplifier, the feedback loop comprising:
       an offset generator coupled to the output signal, and having a first offset signal derived from the output signal shifted according to a target signal level, and a second offset signal derived from a base signal which is not shifted according to the target signal level, the offset generator comprising:
          a pair of alternating current put terminals coupled to a first pair of differential transistors the pair of alternating current input terminals being coupled to the first and second differential signal components;
          a pair of direct current input terminals coupled to a second pair of differential transistors; and
          a direct current voltage source coupled to the pair of direct current input terminals and having a potential across the pair of direct current input terminals equivalent to a target voltage;
          wherein the first pair of differential transistors and the second pair of differential transistors share a common pair of load resistors;
       a pulse train generator coupled to the first and second offset signals and having a pulse train output based on comparisons between the first and second offset signals; and
       a feedback signal generator coupled to the pulse train output and having an output of a feedback signal based on energy content of the pulse train output;
    wherein the feedback signal is coupled to the variable gain amplifier.

11. The apparatus of claim 10, wherein:
    the variable gain amplifier is a differential amplifier having a differential output with first and second differential signal components;
    the first differential signal component provides the output signal; and
    the second differential signal component provides the base signal.

12. The apparatus of claim 11, wherein the feedback signal generator comprises a low-pass filter coupled to the pulse train generator, the low-pass filter having an input with the pulse train output coupled thereto, and an output of an average energy content signal.

13. The apparatus of claim 12, wherein the feedback signal generator further comprises a comparator coupled to the low-pass filter, the comparator having an input with the average energy content signal coupled thereto, and an output of a feedback voltage.

14. The apparatus of claim 13, wherein the feedback signal generator further comprises a signal generator coupled to the comparator and having an input with the feedback voltage coupled thereto, and an output of the feedback signal.

15. The apparatus of claim 11, wherein the pulse train generator comprises a fixed-bias amplifier string coupled to the offset generator.

16. An apparatus for providing gain control for a differential input signal, comprising:
    a variable gain differential amplifier comprising:
       a pair of input ports for coupling the differential input signal;
       a pair of amplifier output ports; and
       a feedback signal port;
    a feedback loop coupled to the variable gain differential amplifier, the feedback loop comprising:
       an offset generator comprising:
          a first pair of differential transistors coupled to the pair of amplifier output ports;
          a direct current voltage source coupled to a second pair of differential transistors, the direct current voltage source having a particular potential;
          wherein the offset generator has an output coupled to the first and second pairs of differential transistors, and the first pair of differential transistors and the second pair of differential transistors share a common pair of load resistors;
       a pulse train generator coupled to the offset generator, the pulse train generator coupled to the output of the offset generator, and having a pulse train output;
       a low-pass filter having an input coupled to the pulse train output, and outputting an average energy content signal;
       a comparator coupled to the average energy content signal, and having a regulated voltage output; and
       a voltage-to-current converter coupled to the regulated voltage output and having a feedback current output coupled to the feedback signal port of the variable gain differential amplifier.

17. The apparatus of claim 16, wherein the pulse train generator comprises a plurality of serially coupled limiting amplifiers.

* * * * *